(12) United States Patent
Oikawa et al.

(10) Patent No.: US 11,107,615 B2
(45) Date of Patent: Aug. 31, 2021

(54) MAGNETIZATION ROTATIONAL ELEMENT, MAGNETORESISTANCE EFFECT ELEMENT, AND MEMORY DEVICE

(71) Applicant: TDK CORPORATION, Tokyo (JP)

(72) Inventors: Tohru Oikawa, Tokyo (JP); Tomoyuki Sasaki, Tokyo (JP); Yohei Shiokawa, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 243 days.

(21) Appl. No.: 16/069,347

(22) PCT Filed: Feb. 22, 2018

(86) PCT No.: PCT/JP2018/006480
§ 371 (c)(1),
(2) Date: Jul. 11, 2018

(87) PCT Pub. No.: WO2018/155562
PCT Pub. Date: Aug. 30, 2018

(65) Prior Publication Data
US 2020/0168383 A1 May 28, 2020

(30) Foreign Application Priority Data
Feb. 24, 2017 (JP) .............................. JP2017-033053

(51) Int. Cl.
*H01F 10/32* (2006.01)
*H01L 43/10* (2006.01)
(Continued)

(52) U.S. Cl.
CPC .......... *H01F 10/329* (2013.01); *G11C 11/161* (2013.01); *H01F 10/3254* (2013.01); *H01L 43/02* (2013.01); *H01L 43/10* (2013.01)

(58) Field of Classification Search
CPC ....... H01L 27/222; H01L 43/02; H01L 43/08; H01L 43/10; H01L 10/3231;
(Continued)

(56) References Cited

U.S. PATENT DOCUMENTS

| 8,350,347 B2 * | 1/2013 | Gaudin ................... H01L 43/02 257/421 |
| 10,255,962 B1 * | 4/2019 | El Baraji ............ H01F 10/3286 |

(Continued)

FOREIGN PATENT DOCUMENTS

| GN | 102467954 A | 5/2012 |
| JP | 2011-258596 A | 12/2011 |

(Continued)

OTHER PUBLICATIONS

Oogane, Mikihiko et al.; "Magnetic Damping in Ferromagnetic Thin Films"; Japanese Journal of Applied Physics, vol. 45, pp. 3889-3891; Published May 9, 2006.

(Continued)

*Primary Examiner* — Earl N Taylor
(74) *Attorney, Agent, or Firm* — Oliff PLC

(57) ABSTRACT

A magnetization rotational element includes a ferromagnetic metal layer, and a spin-orbit torque wiring extending in a first direction intersecting a lamination direction of the ferromagnetic metal layer and having the ferromagnetic metal layer positioned on one surface thereof, in which a direction of spin injected from the spin-orbit torque wiring into the ferromagnetic metal layer intersects a magnetization direction of the ferromagnetic metal layer, and a damping constant of the ferromagnetic metal layer is larger than 0.01.

10 Claims, 10 Drawing Sheets

(51) Int. Cl.
*G11C 11/16* (2006.01)
*H01L 43/02* (2006.01)

(58) Field of Classification Search
CPC .............. H01F 10/3222; H01F 10/3236; H01F 10/3254; H01F 10/3286; H01F 10/329; G11C 11/161; G11C 19/08
See application file for complete search history.

(56) References Cited

U.S. PATENT DOCUMENTS

| | | | | |
|---|---|---|---|---|
| 10,847,197 | B2* | 11/2020 | Buhrman | G11C 11/18 |
| 10,847,711 | B2* | 11/2020 | Deshpande | H01L 43/12 |
| 2008/0088980 | A1* | 4/2008 | Kitagawa | H01F 10/329 |
| | | | | 360/313 |
| 2012/0120708 | A1 | 5/2012 | Jin et al. | |
| 2013/0094284 | A1* | 4/2013 | Ohno | H01L 43/10 |
| | | | | 365/158 |
| 2014/0056060 | A1* | 2/2014 | Khvalkovskiy | G11C 11/1675 |
| | | | | 365/158 |
| 2014/0269032 | A1* | 9/2014 | Ong | G11C 11/16 |
| | | | | 365/158 |
| 2015/0036415 | A1* | 2/2015 | Di Pendina | G11C 11/1675 |
| | | | | 365/148 |
| 2015/0097159 | A1* | 4/2015 | Apalkov | H01F 41/302 |
| | | | | 257/31 |
| 2015/0348606 | A1* | 12/2015 | Buhrman | G11C 11/1675 |
| | | | | 365/158 |
| 2016/0276006 | A1* | 9/2016 | Ralph | G11C 11/1675 |
| 2017/0178705 | A1* | 6/2017 | Buhrman | G11C 11/1675 |
| 2017/0222135 | A1* | 8/2017 | Fukami | H01L 27/228 |
| 2018/0033954 | A1* | 2/2018 | Aradhya | H01F 10/3272 |
| 2018/0182954 | A1* | 6/2018 | Sayed | H01L 43/08 |
| 2018/0351087 | A1* | 12/2018 | Choi | H01F 10/329 |
| 2019/0165254 | A1* | 5/2019 | Lee | H01L 27/228 |
| 2019/0259941 | A1* | 8/2019 | Yang | G11C 11/161 |
| 2020/0168383 | A1* | 5/2020 | Oikawa | G11C 11/161 |

FOREIGN PATENT DOCUMENTS

| | | |
|---|---|---|
| JP | 2014-045196 A | 3/2014 |
| JP | 2014-179618 A | 9/2014 |
| WO | 2016/021468 A1 | 2/2016 |
| WO | 2016/159017 A1 | 10/2016 |

OTHER PUBLICATIONS

Miron, Ioan Mihai et al.; "Perpendicular switching of a single ferromagnetic layer induced by in-plane current injection"; Nature, vol. 476, p. 189-193; Aug. 11, 2011.

Kato, Y.K. et al., "Observation of the Spin Hall Effect in Semiconductors.", Science, pp. 1910-1913, vol. 306, (2004).

Liu, Luqiao et al., "Spin torque switching with the giant spin Hall effect of tantalum.", Science, vol. 336, No. 555 (2012).

Liu, Luqiao et al., "Current-Induced Switching of Perpendicularly Magnetized Magnetic Layers Using Spin Torque from the Spin Hall Effect", Physical Review Letters, pp. 096602-1 to 096602-5, vol. 109, (2012).

Lee, Ki-Seung et al., "Threshold current for switching of a perpendicular magnetic layer induced by spin Hall effect.", Applied Physics Letters, pp. 1-17, vol. 102 (2013).

Lee, Ki-Seung et al., "Thermally activated switching of perpendicular magnet by spin-orbit spin torque.", Applied Physics Letters, pp. 072413-1 to 072413-5, vol. 104, (2014).

Fukami, Shunsuke et al., "Magnetization switching by spin-orbit torque in an antiferromagnet-ferromagnet bilayer system", Nature Materials, pp. 535-541, vol. 15, (2016).

Fukami, S. et al., "A spin-orbit torque switching scheme with collinear magnetic easy axic and current configuration.", Nature Nanotechnology, pp. 1-4, (2016).

Takahashi, S. et al., "Spin injection and detection in magnetic nanostructures.", Physical Review B, The American Physical Society, pp. 052409-1 to 052409-4, vol. 67, (2003).

Seo, Yeongkyo et al., "Area-Efficient SOT-MRAM With a Schottky Diode.", IEEE Electron Device Letters, pp. 982-985, vol. 37, No. 8, (2016).

Zhang, Wei et al., "Spin Hall Effects in Metallic Antiferromagnets.", Physical Review Letter, pp. 196602-1 to 196602-6, vol. 113, (2014).

* cited by examiner (a)

(b)

MAGNETIZATION ROTATIONAL ELEMENT, MAGNETORESISTANCE EFFECT ELEMENT, AND MEMORY DEVICE

TECHNICAL FIELD

The present invention relates to a magnetization rotational element, a magnetoresistance effect element, and a memory device.

Priority is claimed on Japanese Patent Application No. 2017-033053, filed in Japan on Feb. 24, 2017, the content of which is incorporated herein by reference.

BACKGROUND ART

A giant magnetoresistance (GMR) element formed of a multilayer film including a ferromagnetic layer and a nonmagnetic layer, and a tunnel magnetoresistance (TMR) element in which an insulating layer (a tunnel barrier layer, a barrier layer) is used for a nonmagnetic layer are known. These elements are used for magnetic sensors, high frequency components, magnetic heads, magnetic random access memories (MRAMs), and the like.

In an MRAM, data is read and written by utilizing characteristics in which the element resistance of a TMR element changes as magnetization directions of two ferromagnetic layers sandwiching an insulating layer change. As a writing method of MRAMs, a method of performing writing (magnetization rotation) by utilizing a magnetic field generated by a current, and a method of performing writing (magnetization rotation) by utilizing a spin transfer torque (STT) generated by causing a current to flow in a lamination direction of a magnetoresistance effect element are known.

In a magnetoresistance effect element that performs writing using an STT, attempts have been made to reduce a damping constant of the ferromagnetic metal layer that performs magnetization rotation. For example, Patent Literature 1 describes that the damping constant is set to 0.01 or less. It is known that a critical writing current density using an STT is proportional to a damping constant of the ferromagnetic metal layer, and from a viewpoint of energy saving, high durability and high integration, it is preferable to use a material having a low damping constant. In recent years, there has been an expectation that Mn—Ga and Mn—Ge alloys will be able to be used for low damping constant materials. However, when the damping constant of a ferromagnetic metal layer is low, there is a possibility of erroneous writing due to the reading current, and a problem of lowered reliability in a device also occurs at the same time.

A damping constant is a physical quantity originating from a spin-orbit interaction. Therefore, the damping constant has a close relationship with magnetic anisotropy energy. Generally, when a damping constant decreases, magnetic anisotropy energy also decreases. As the magnetic anisotropy energy becomes smaller, magnetization of the ferromagnetic metal layer is more likely to be rotated, and reading and writing of data becomes easier.

Further, Non-Patent Literature 1 describes that a damping constant of a Co—Fe alloy which is a material generally used for a magnetoresistance effect element is less than 0.01. The same is true of a Co—Fe—B alloy manufactured by sputtering. A case in which a damping constant of the Co—Fe—B alloy is 0.01 or more is only with a structure other than a BCC structure in which high output characteristics cannot be obtained. Therefore, ferromagnetic materials having a damping constant less than 0.01 are used for magnetoresistance effect elements using an STT.

On the other hand, in recent years, attention has been focused on magnetization rotation utilizing a pure spin current generated by a spin-orbit interaction as a means for reducing an inversion current (for example, Non-Patent Literature 2). The pure spin current generated by a spin-orbit interaction induces a spin-orbit torque (SOT). The pure spin current is generated when the same number of upward spin electrons and downward spin electrons flow in opposite directions to each other, and a flow of electric charge is canceled out. Therefore, a current flowing through a magnetoresistance effect element is zero, and thus a service life of the magnetoresistance effect element is expected to be prolonged.

CITATION LIST

Patent Literature

[Patent Literature 1]
Japanese Unexamined Patent Application, First Publication No. 2011-258596

Non-Patent Literature

[Non-Patent Literature 1]
M. Oogane, T. Wakitani, S. Yakata, R. Yilgin, Y. Ando, A. Sakuma and T. Miyazaki, Japanese Journal of Applied Physics, Vol. 45, pp. 3889-3891 (2006).
[Non-Patent Literature 2]
I. M. Miron, K. Garello, GGaudin, P.-J. Zermatten, M. V. Costache, S. Auffret, S. Bandiera, B. Rodmacq, A. Schuhl, and P. Gambardella, Nature, 476, 189 (2011).

SUMMARY OF INVENTION

Technical Problem

Research on magnetization rotational elements using a spin-orbit torque (SOT) has just begun. A magnetization rotational element using the SOT is different from a magnetization rotational element using a spin transfer torque (STT) in magnetization rotation mechanism. For this reason, an appropriate configuration for driving a magnetization rotational element using the SOT has not been sufficiently ascertained.

The present invention has been made in view of the above problems, and it is an object of the present invention to provide a magnetization rotational element capable of quickly performing magnetization rotation.

Solution to Problem

The present inventors found that magnetization rotation can be performed quickly in a magnetization rotational element using an SOT by increasing a damping constant of a ferromagnetic metal layer. That is, the present invention provides the following means to solve the above-described problems. The following means are the same as a technical idea of increasing the damping constant.

(1) A magnetization rotational element according to a first aspect includes a ferromagnetic metal layer, and a spin-orbit torque wiring extending in a first direction intersecting a lamination direction of the ferromagnetic metal layer and having the ferromagnetic metal layer positioned on one surface thereof, in which a direction of spin injected from the spin-orbit torque wiring into the ferromagnetic metal layer intersects a magnetization direction of the ferromagnetic metal layer, and a damping constant of the ferromagnetic metal layer is larger than 0.01. The magnetization rotational element according to the first aspect may include a ferromagnetic metal layer, and a spin-orbit torque wiring extending in a first direction intersecting a lamination direction of the ferromagnetic metal layer and joining to the ferromagnetic metal layer, in which a direction of spin injected from the spin-orbit torque wiring into the ferromagnetic metal layer may intersect a magnetization direction of the ferromagnetic metal layer, and a damping constant of the ferromagnetic metal layer may be larger than 0.01.

(2) A magnetization rotational element according to a second aspect includes a ferromagnetic metal layer, and a spin-orbit torque wiring extending in a first direction intersecting a lamination direction of the ferromagnetic metal layer and having the ferromagnetic metal layer positioned on one surface thereof, in which a direction of spin injected from the spin-orbit torque wiring into the ferromagnetic metal layer intersects a magnetization direction of the ferromagnetic metal layer, and the ferromagnetic metal layer includes one or more substances selected from the group consisting of a multilayer film of Co and Pt, a Co—Ni alloy, $(Co_xFe_{1-x})_{1-y}B_y$ (x>0.75 and y>0.20), an alloy containing a rare-earth element, $Fe_4N$, and an Fe—Co—N alloy. Further, the magnetization rotational element according to the second aspect may include a ferromagnetic metal layer, and a spin-orbit torque wiring extending in a first direction intersecting a lamination direction of the ferromagnetic metal layer and joining to the ferromagnetic metal layer, in which a direction of spin injected from the spin-orbit torque wiring into the ferromagnetic metal layer may intersect a magnetization direction of the ferromagnetic metal layer, and the ferromagnetic metal layer may include one or more substances selected from the group consisting of a multilayer film of Co and Pt, a Co—Ni alloy, $(Co_xFe_{1-x})_{1-y}B_y$ (x>0.75 and y>0.20), an alloy containing a rare-earth element, $Fe_4N$, and an Fe—Co—N alloy.

(3) A magnetization rotational element according to a third aspect includes a ferromagnetic metal layer, a spin-orbit torque wiring extending in a first direction intersecting a lamination direction of the ferromagnetic metal layer and having the ferromagnetic metal layer positioned on one surface thereof, and an insertion layer provided between the ferromagnetic metal layer and the spin-orbit torque wiring, in which a direction of spin injected from the spin-orbit torque wiring into the ferromagnetic metal layer intersects a magnetization direction of the ferromagnetic metal layer, and the insertion layer includes a heavy metal having a melting point of 2000° C. or higher or an alloy containing the heavy metal and a film thickness thereof is equal to or less than twice the atomic radius.

The magnetization rotational element according to still another aspect may include a ferromagnetic metal layer, a spin-orbit torque wiring extending in a first direction intersecting a lamination direction of the ferromagnetic metal layer and joining to the ferromagnetic metal layer, and an insertion layer provided between the ferromagnetic metal layer and the spin-orbit torque wiring, in which a direction of spin injected from the spin-orbit torque wiring into the ferromagnetic metal layer may intersect a magnetization direction of the ferromagnetic metal layer, and the insertion layer may include an alloy containing a rare-earth element and a film thickness thereof may be equal to or less than twice the atomic radius.

(4) In the magnetization rotational element according to the above aspects, a direction of the spin injected from the spin-orbit torque wiring into the ferromagnetic metal layer may be inclined by 45° or more and 90° or less with respect to a magnetization direction of the ferromagnetic metal layer.

(5) In the magnetization rotational element according to the above aspects, a film thickness of the ferromagnetic metal layer may be 4 nm or less.

(6) A magnetoresistance effect element according to a fourth aspect includes a magnetization rotational element according to above aspects, and a nonmagnetic layer and a second ferromagnetic metal layer laminated in this order on a surface of the ferromagnetic metal layer on a side opposite to the spin-orbit torque wiring.

(7) A memory device according to a fifth aspect includes the magnetoresistance effect element according to the above aspects.

Advantageous Effects of Invention

According to the magnetization rotational element of the above aspects, the magnetization rotation can be performed quickly.

DESCRIPTION OF EMBODIMENTS

Figure 1:
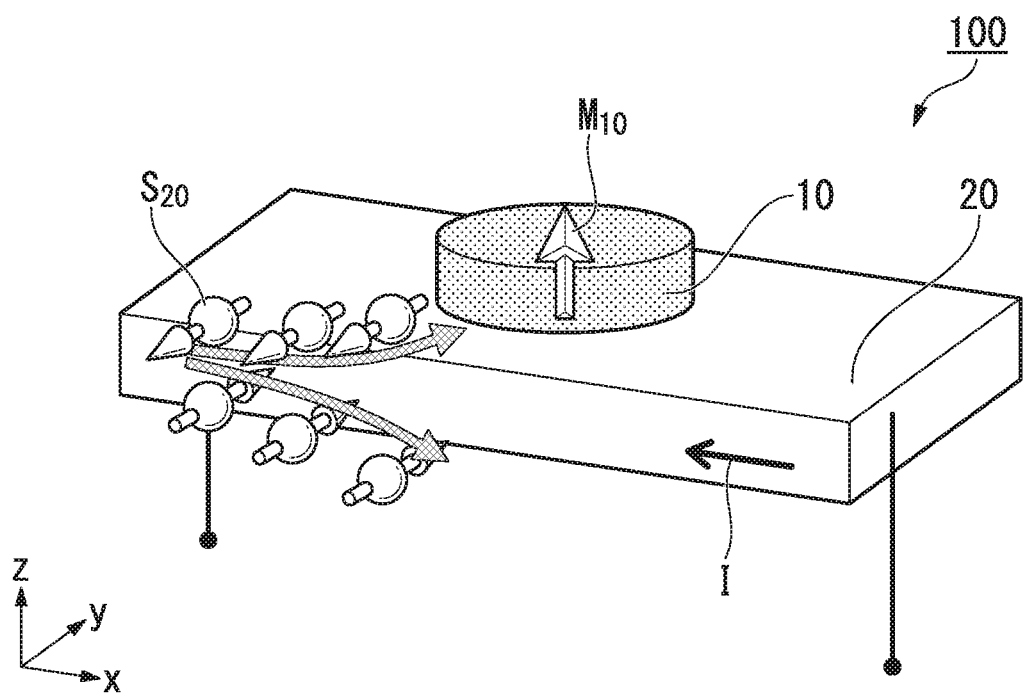
FIG. 1 is a perspective view schematically illustrating a magnetization rotational element according to a first embodiment.

Hereinafter, the present invention will be described in detail with reference to the drawings as appropriate. In the drawings used in the following description, there are cases in which characteristic portions are appropriately enlarged for convenience of illustration so that characteristics of the present invention can be easily understood, and dimensional proportions of respective constituent elements may be different from actual ones. Materials, dimensions, and the like illustrated in the following description are merely examples, and the present invention is not limited thereto and can be implemented with appropriate modifications within the range in which the effects of the present invention are achieved.

First Embodiment (Magnetization Rotational Element)

FIG. 1 is a perspective view schematically illustrating a magnetization rotational element according to a first embodiment. A magnetization rotational element 100 according to the first embodiment includes a ferromagnetic metal layer 10 and a spin-orbit torque wiring 20.

In the following embodiments, a lamination direction of the ferromagnetic metal layer 10 is a z direction, a first direction in which the spin-orbit torque wiring 20 extends is an x direction, and a second direction perpendicular to both the x direction and z direction is a y direction. In the present embodiment, the x direction is perpendicular to the z direction. The lamination direction of the ferromagnetic metal layer 10 means a lamination direction of the ferromagnetic metal layer 10 and the spin-orbit torque wiring.

<Ferromagnetic Metal Layer>

The ferromagnetic metal layer 10 is a ferromagnetic material in which a magnetization $M_{10}$ is oriented in a predetermined direction. In FIG. 1, the magnetization $M_{10}$ is set in a vertical magnetization film perpendicular to a lamination surface of the ferromagnetic metal layer 10 (z direction), but a direction of the magnetization $M_{10}$ may be in any direction. A magnetization direction is changed when an external force or the like is applied. Further, the lamination surface of the ferromagnetic metal layer 10 is a surface perpendicular to the lamination direction of the ferromagnetic metal layer 10.

In the present embodiment, a damping constant of the ferromagnetic metal layer 10 is larger than 0.01. The damping constant of the ferromagnetic metal layer 10 is larger than 0.01, preferably 0.015 or more, more preferably 0.02 or more, still more preferably 0.03 or more, and particularly preferably 0.05 or more. The damping constant is a constant influenced by a magnitude of a spin-orbit interaction. NiFe or the like has a damping constant of around 0.01, but a coercivity is very small. Therefore, it is easy to cause noise or rewriting due to a current flowing in an external magnetic field or integrated circuit. A material having a damping constant of 0.02 or more generally has a sufficient coercivity, and noise and rewriting thereof do not easily occur and a stable operation can be realized. Further, when the damping constant is large, magnetization rotation of the ferromagnetic metal layer 10 can be performed quickly. A detailed reason why the magnetization rotation can be performed quickly will be described below The damping constant varies depending on various parameters such as types and crystalline properties of a material constituting the ferromagnetic metal layer 10, thicknesses of the ferromagnetic metal layer 10, measurement methods, or the like. The damping constant in the present embodiment is a damping constant obtained by the following procedures.

A desired magnetic film is formed on a substrate having an insulating layer formed on a surface thereof with a sufficient thickness. A magnetic film between 2 nm and 20 nm is selected according to actual usage conditions. After the magnetic film is formed, an oxide film of 100 nm is formed in order to prevent oxidation of the magnetic layer. For example, silica, aluminum oxide, magnesium oxide, or the like can be used for the oxide film. A photoresist is applied, then exposed by photolithography, and developed to form a shape of the element.

A shape of the element is a cylindrical shape having a diameter of 40 nm to 100 nm according to actual usage conditions. The oxide film and the magnetic film are etched using an ion beam, and an etched sidewall of the magnetic layer is protected by an oxide film. The oxide film is formed to have a thickness of 50 nm. Similarly, a short-circuit type coplanar line is formed by photolithography. A line width and a length of a central conductor of the coplanar line are 1 μm and 100 μm, respectively. A microwave magnetic field generated by the coplanar line contributes to ferromagnetic resonance (FMR). Therefore, of the magnetic film processed into the cylindrical shape, a portion of 100×1 μm² immediately beneath the central conductor of the coplanar line contributes to the ferromagnetic resonance.

The element is placed on an electromagnet that generates a magnetic field in a direction of an easy magnetization axis of the magnetic film, and is connected to a microwave generator and a vector network analyzer using a coplanar microprobe. An S11 parameter (reflection coefficient) of the coplanar line is measured using the network analyzer, and microwave absorption spectrum by FMR of the magnetic film is observed. Obtained waveforms are fitted with a Lorenz function to obtain a resonant frequency $f_0$ and a half-value width Δf. From these values, a damping constant α is calculated using an equation $\alpha=\Delta f/(2f_0)$.

A film thickness of the ferromagnetic metal layer 10 is preferably 4 nm or less. As described above, the damping constant is also influenced by a film thickness of the ferromagnetic metal layer 10. When a film thickness of the ferromagnetic metal layer 10 becomes thin, a damping constant thereof tends to increase. The reason for this is thought to be that the magnetization in the ferromagnetic metal layer 10 is strongly influenced by a laminated interface due to the thinned film thickness of the ferromagnetic metal layer 10. A lower limit value of the film thickness of the ferromagnetic metal layer 10 is not particularly limited, but is preferably 0.5 nm.

<Spin-Orbit Torque Wiring>

The spin-orbit torque wiring 20 extends in the x direction. The spin-orbit torque wiring 20 is connected (directly joined) to one surface of the ferromagnetic metal layer 10 perpendicular to the z direction.

The spin-orbit torque wiring 20 is made of a material in which a pure spin current is generated by a spin Hall effect when a current flows. As such a material, any material may be sufficient as long as a pure spin current is generated in the spin-orbit torque wiring 20. A material constituting the spin-orbit torque wiring 20 is not limited to a material formed of a single element, and a material formed of a part configured with a material from which a pure spin current is generated and a part configured with a material from which pure spin current is not generated, or the like may be used.

Figure 2:
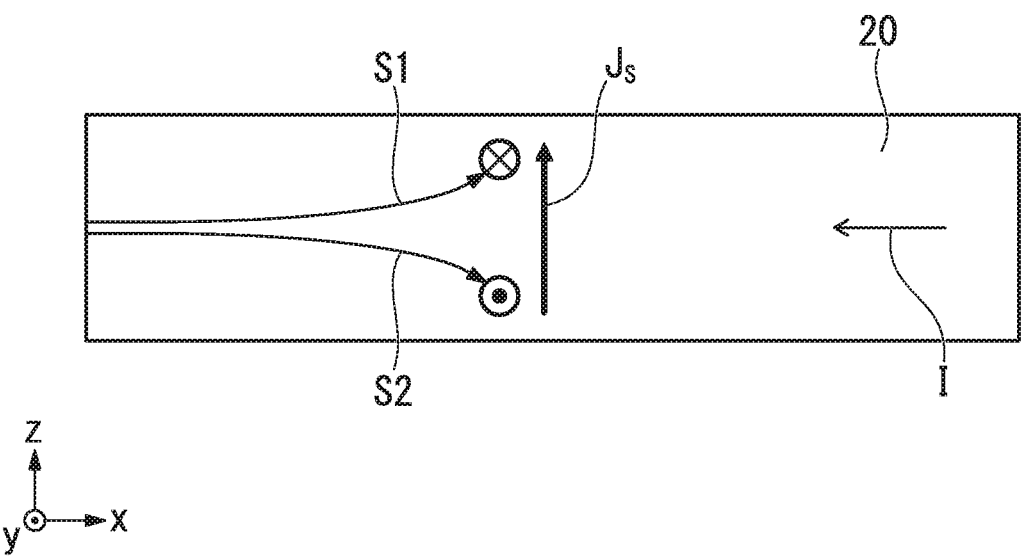
FIG. 2 is a schematic view for describing a spin Hall effect.

The spin Hall effect is a phenomenon in which a pure spin current is induced in a direction perpendicular to a current direction on the basis of a spin-orbit interaction when a current flows in a material. FIG. 2 is a schematic view for describing a spin Hall effect. FIG. 2 is a cross-sectional view taken along the x direction (that is, in the xz plane) of the spin-orbit torque wiring 20 illustrated in FIG. 1. A mechanism in which a pure spin current is generated by the spin Hall effect will be described with reference to FIG. 2.

As illustrated in FIG. 2, when a current I flows in an extending direction of the spin-orbit torque wiring 20, a first spin S1 oriented to a side far from the paper surface and a second spin S2 oriented to a side close to the paper surface are respectively bent in a direction perpendicular to the current. A normal Hall effect and a spin Hall effect are the same in that motion (movement) of electric charges (electrons) is bent in a motion (movement) direction, but, while charged particles moving in a magnetic field are subjected to a Lorentz force and a direction of the motion is bent in the normal Hall effect, the spin Hall effect is greatly different in that, even though there is no magnetic field, when electrons merely move (when a current merely flows), a moving direction thereof is bent.

Since the number of electrons of the first spin S1 is equal to the number of electrons of the second spin S2 in a nonmagnetic material (a material which is not a ferromagnetic material), the number of electrons of the first spin S1 directed upward and the number of electrons of the second spin S2 directed downward in the drawing are the same. Therefore, the current as a net flow of electric charge is zero. This spin current that does not accompany a current is particularly called a pure spin current.

When an electrical current is passed through a ferromagnetic material, the fact that the first spin S1 and the second spin S2 are bent in opposite directions is the same. On the other hand, a ferromagnetic material is in a state in which either the first spin S1 or the second spin S2 is greater than the other, and as a result, it is different in that a net flow of electric charges occurs (a voltage is generated). Therefore, as a material of the spin-orbit torque wiring 20, a material formed of only a ferromagnetic material is not included.

Here, when a flow of electrons in the first spin S1 is expressed as J↑, a flow of electrons in the second spin S2 is expressed as J↓, and a spin current is expressed as $J_s$, it is defined by $J_s=J↑-J↓$. In FIG. 2, the pure spin current $J_s$ flows upward in the drawing. Here, $J_s$ is a flow of electrons with a polarizability of 100%.

The spin-orbit torque wiring 20 may include a nonmagnetic heavy metal. Here, "heavy metal" is used to mean a metal having a specific gravity equal to or higher than that of yttrium. The spin-orbit torque wiring 20 may be formed of only a nonmagnetic heavy metal.

In this case, the nonmagnetic heavy metal is preferably a nonmagnetic metal having a high atomic number such as an atomic number of 39 or higher having d electrons or f electrons in an outermost shell. This is because such a nonmagnetic metal has a large spin-orbit interaction which causes a spin Hall effect. The spin-orbit torque wiring 20 may be formed of only a nonmagnetic metal having a high atomic number such as the atomic number of 39 or higher having d electrons or f electrons in an outermost shell.

Normally, when a current flows in a metal, all of the electrons move in a direction opposite to the current regardless of a direction of their spin, whereas, since the nonmagnetic metal with a high atomic number having d electrons and f electrons in an outermost shell has a large spin-orbit interaction, a movement direction of electrons depends on a spin direction of the electrons due to the spin Hall effect and the pure spin current $J_s$ is easily generated.

In addition, the spin-orbit torque wiring 20 may include a magnetic metal. The magnetic metal indicates a ferromagnetic metal or an antiferromagnetic metal. This is because, when a very small amount of magnetic metal is contained in a nonmagnetic metal, the spin-orbit interaction is enhanced and spin current generation efficiency with respect to a current flowing through the spin-orbit torque wiring 20 increases. The spin-orbit torque wiring 20 may be formed of only an antiferromagnetic metal.

Since a spin-orbit interaction is caused by an inherent internal field of a substance of the spin-orbit torque wiring material (by magnetic action), a pure spin current is generated even in a nonmagnetic material. When a very small amount of a magnetic metal is added to the spin-orbit torque wiring material, since the magnetic metal itself scatters electron spins flowing there through, spin current generation efficiency thereof improves. However, when an additive amount of the magnetic metal is excessively increased, the generated pure spin current is scattered by the added magnetic metal, and as a result, an effect of decreasing the spin current becomes strong. Therefore, a molar ratio of the added magnetic metal is preferably sufficiently smaller than a molar ratio of a main component of a pure spin generation part in the spin-orbit torque wiring. As a reference, the molar ratio of the added magnetic metal is preferably 3% or less.

In addition, the spin-orbit torque wiring 20 may include a topological insulator. The spin-orbit torque wiring 20 may be formed only of the topological insulator. The topological insulator is a material in which the interior of the substance is an insulator or a highly resistive material while a spin-polarized metallic state is generated on a surface thereof. In a substance, there is an internal magnetic field called a spin-orbit interaction. Therefore, a new topological phase is exhibited even without an external magnetic field due to an effect of the spin-orbit interaction. This is the topological insulator and it can generate a pure spin current with high efficiency by a strong spin-orbit interaction and breaking of reversal symmetry at an edge.

As the topological insulator, for example, SnTe, $Bi_{1.5}Sb_{0.5}Te_{1.7}Se_{1.3}$, $T_1BiSe_2$, $Bi_2Te_3$, $(Bi_{1-x}Sb_x)_2Te_3$, and the like are preferable. These topological insulators can generate the spin current with high efficiency.

The magnetization rotational element 100 may also have constituent elements other than the ferromagnetic metal layer 10 and the spin-orbit torque wiring 20. For example, it may have a substrate or the like as a support. The substrate is preferably excellent in flatness, and Si, AlTiC, or the like can be used as a material thereof, for example.

<Operation of Magnetization Rotational Element>

In FIG. 1, a pure spin current generated in the spin-orbit torque wiring 20 diffuses and flows into the ferromagnetic metal layer 10. That is, spin $S_{20}$ generated in the spin-orbit torque wiring 20 is injected into the ferromagnetic metal layer 10.

A direction of the injected spin $S_{20}$ intersects a direction of the magnetization $M_{10}$ of the ferromagnetic metal layer 10. Behavior of the magnetization rotation of the magnetization $M_{10}$ is different depending on a relationship between the direction of the injected spin $S_{20}$ and the direction of the magnetization $M_{10}$ of the ferromagnetic metal layer 10.

Figure 3:
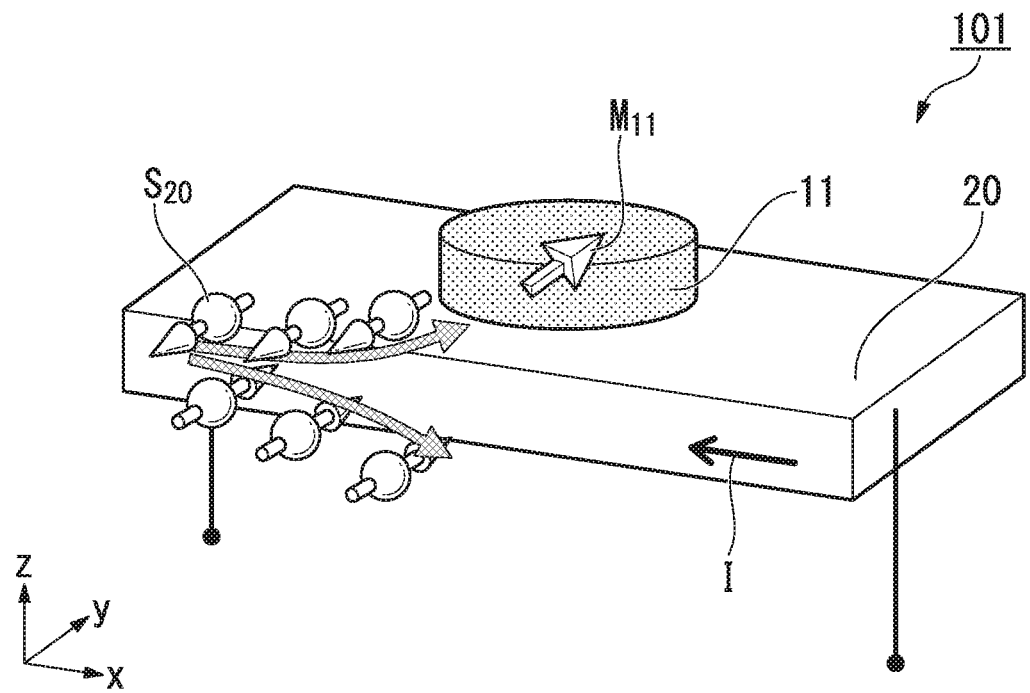
FIG. 3 is a perspective view schematically illustrating a magnetization rotational element in which a direction of spin injected into a ferromagnetic metal layer is parallel to a magnetization direction of the ferromagnetic metal layer.

FIG. 3 is a perspective view schematically illustrating a magnetization rotational element 101 in which a direction of spin injected into the ferromagnetic metal layer is parallel to a magnetization direction of the ferromagnetic metal layer. In a ferromagnetic metal layer 11 illustrated in FIG. 3, magnetization $M_{11}$ is oriented in a +y direction in an xy planar direction. The direction of the spin $S_{20}$ injected from the spin-orbit torque wiring 20 into the ferromagnetic metal layer 11 is oriented in the −y direction.

When the spin $S_{20}$ is injected into the ferromagnetic metal layer 11, the spin $S_{20}$ applies a torque to rotate the magnetization $M_{11}$ in the −y direction. On the other hand, a damping torque trying to stay in the +y direction is also applied to the magnetization $M_{11}$. When an anisotropic external magnetic field is applied in this state, the magnetization M 11 rotates while the torque trying to rotate and the damping torque are maintained in a balanced relationship. That is, when the magnetization $M_{11}$ is influenced by the two torques, the magnetization $M_{11}$ first rises in the z direction while performing precessional motion from the +y direction as an initial behavior, and then is rotated in the −y direction while performing precessional motion.

Figure 4:
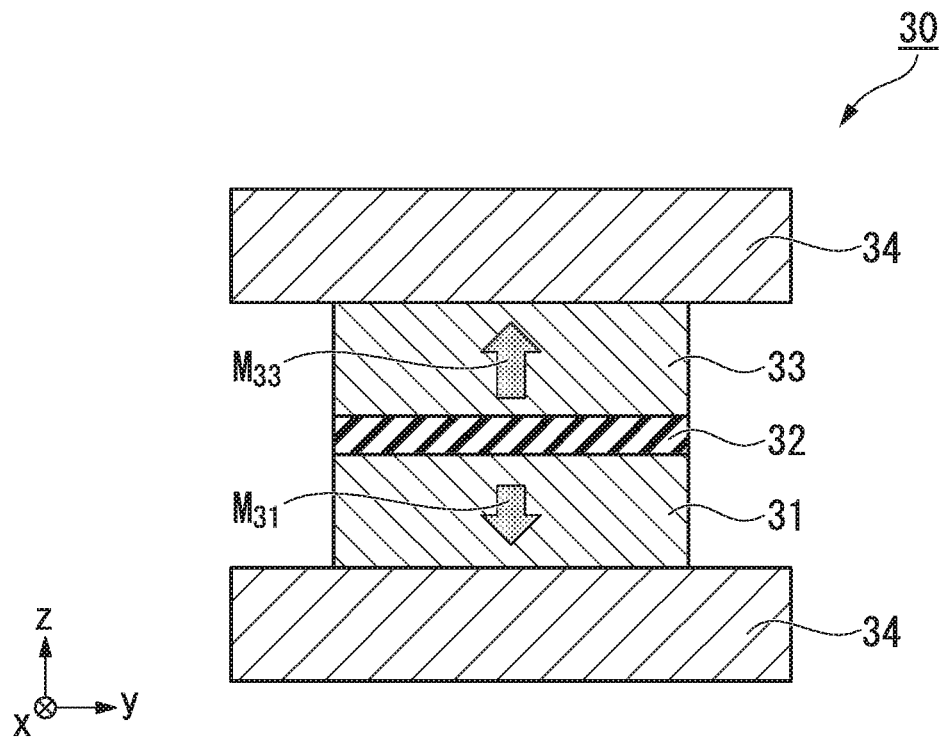
FIG. 4 is a schematic cross-sectional view of a magnetoresistance effect element that performs magnetization rotation using a spin transfer torque (STT).

This behavior of magnetization rotation is the same behavior as magnetization rotation using a spin transfer torque (STT). FIG. 4 is a schematic cross-sectional view of a magnetoresistance effect element that performs magnetization rotation using the STT. The magnetoresistance effect element 30 illustrated in FIG. 4 includes a free layer 31, a nonmagnetic layer 32, and a fixed layer 33 which are laminated in that order and are interposed between two wirings 34.

In the magnetoresistance effect element 30 illustrated in FIG. 4, spin is injected from the fixed layer 33 to the free layer 31 when a current flows between the two wirings 34. The spin injected from the fixed layer 33 has the same +z direction as magnetization $M_{33}$ of the fixed layer 33. Therefore, also in a case in which magnetization $M_{31}$ of the free layer 31 is rotated from the −z direction to the +z direction, the magnetization $M_{31}$ is rotated while performing precessional motion.

On the other hand, as illustrated in FIG. 1, in the magnetization rotational element 100 according to the first embodiment, a direction of the injected spin $S_{20}$ is perpendicular to a direction of the magnetization $M_{10}$ of the ferromagnetic metal layer 10. Therefore, the magnetization $M_{10}$ oriented in the z direction receives a torque in the y direction as if an external magnetic field is applied in the y direction.

Unlike the case in which the direction of the spin injected into the ferromagnetic metal layer is parallel to the magnetization direction of the ferromagnetic metal layer illustrated in FIG. 3, a vector direction to which the torque is applied is perpendicular to an easy magnetization direction (z direction in FIG. 1). For this reason, this torque is not balanced with the damping torque applied in the +z direction. That is, at the time of magnetization rotation, the magnetization $M_{10}$ first falls quickly from the +z direction to the y direction as an initial behavior due to an influence of the torque applied in the y direction. Then, after the magnetization $M_{10}$ falls down to the y direction, the magnetization $M_{10}$ receives a force that acts on it to be oriented in the easy magnetization direction and is rotated in the −z direction while performing precessional motion.

This initial behavior occurs when the spin $S_{20}$ of a component intersecting an orientation direction of the magnetization MI 0 is injected into the ferromagnetic metal layer 10. Also, since the initial behavior becomes faster as a direction of the torque vector applied to the orientation direction of the magnetization $M_{10}$ becomes different (orientation direction of the injected spin $S_{20}$ becomes differ-ent), the orientation direction of the injected spin $S_{20}$ is preferably inclined by 45° or more and 90° or less with respect to the direction of the magnetization $M_{10}$ of the ferromagnetic metal layer 10, and more preferably perpendicular (inclined by 90°) thereto. Therefore, in addition to the configuration of FIG. 1, for example, a direction of the injected spin $S_{20}$ may be the y direction and an orientation direction of the magnetization $M_{10}$ may be the x direction.

Further, in the magnetization rotational element 100 according to the first embodiment, the damping constant is larger than 0.01. The damping constant is closely related to the magnetic anisotropy energy, and generally the magnetic anisotropy energy increases as the damping constant becomes large. That is, when the damping constant becomes large, a force of the magnetization $M_{10}$ to be oriented in the easy magnetization direction increases.

The magnetization $M_{10}$ in the magnetization rotational element 100 illustrated in FIG. 1 quickly falls from the +z direction to the y direction as an initial behavior and then is rotated in the −z direction while performing precessional motion. When the force of the magnetization $M_{10}$ to be oriented in the easy magnetization direction increases, a speed of the magnetization $M_{10}$ to be oriented in the −z direction becomes faster while the magnetization $M_{10}$ performs precessional motion. The magnetization $M_{10}$ is also influenced by a force to be oriented in the easy magnetization direction even in the initial behavior. However, a vector direction of the force applied to the magnetization $M_{10}$ in the initial behavior is completely different from the easy magnetization direction, and thus the influence is small. Also, since a proportion occupied by the time taken for the initial behavior in the total time required for the magnetization rotation is small, even if the time required for the initial behavior becomes slightly long, the total time required for the magnetization rotation is sufficiently shortened.

In contrast, as illustrated in FIGS. 3 and 4, when a direction of the spin injected into the ferromagnetic metal layer is parallel to a magnetization direction of the ferromagnetic metal layer, the magnetization $M_{11}$ rises in one direction while performing precessional motion as an initial behavior and then is rotated while performing precessional motion. Therefore, even when the damping constant is increased to advance time for the precessional motion in the subsequent stage, time for the precessional motion as the initial behavior becomes longer and the total time required for the magnetization rotation does not change.

As described above, since the magnetization rotational element according to the first embodiment has a large damping constant, magnetization rotation can be performed quickly.

Second Embodiment

A magnetization rotational element according to a second embodiment has the same element configuration as those of the magnetization rotational element according to the first embodiment. The magnetization rotational element according to the second embodiment has a ferromagnetic metal layer and a spin-orbit torque wiring, and a direction of spin injected from the spin-orbit torque wiring into the ferromagnetic metal layer intersects a magnetization direction of the ferromagnetic metal layer.

In the magnetization rotational element according to the second embodiment, the ferromagnetic metal layer includes one or more substances selected from the group consisting of a multilayer film of Co and Pt, a Co—Ni alloy, ($Co_xFe_{1-}$ $_x)_{1-y}B_y$ (x>0.75 and y>0.20), an alloy containing a rare-earth element, $Fe_4N$, and an Fe—Co—N alloy.

These materials have large damping constants and the following values are obtained by measurement, for example.

In [Co(4 Å)/Pt(8 Å)]n which is a multilayer film of Co and Pt, a damping constant α increases along with the number of layers n, and the number of layers n converges to a constant value of approximately 15 or more. When n≥2 or more, 0.15≥α≥0.1 is obtained.

In a case of $Co_xNi_{1-x}$ which is a Co—Ni alloy, α=0.011 (x=0.8), α=0.012 (x=0.5), 0.019 (x=0.2), and 0.035 (x=0.1) can be obtained.

In a case of $(Co_xFe_{1-x})_{1-y}B_y$(x>0.75 and y>0.20) which is a Co—Fe—B alloy, α becomes larger as a relative ratio x of Co to Fe and a substitution amount y of B becomes larger, and α=0.011 (x=0.9 and y=0.22), α=0.011 (x=0.8 and y=0.24), α=0.015 (x=0.9 and y=0.3), α=0.015 (x=0.8 and y=0.33) can be obtained.

In transition metals including rare-earth elements, a damping constant is increased due to enhancement of a spin-orbit interaction. For example, in a case of $Fe_{1-x}Gd_x$ (x≥0.05) which is an Fe—Gd alloy, α=0.011 (x=0.08), α=0.033 (x=0.14), and α=0.043 (x=0.2) can be obtained. Also, in addition to the Fe—Gd alloy, an Sm—Fe alloy ($SmFe_{12}$) and an Ho—Co alloy ($HoCo_2$) are examples of alloys containing rare earth elements. The Sm—Fe alloy is a tetragonal magnetic material in which a c-axis length is shorter than an a-axis length. When the c-axis length is shorter than the a-axis length, an axis of easy magnetization of a first ferromagnetic layer 4 is easily oriented in an in-plane direction. The Ho—Co alloy is a tetragonal magnetic material in which a c-axis length is longer than an a-axis length. When the c-axis length is longer than the a-axis length, an axis of easy magnetization of the first ferromagnetic layer 4 is easily oriented in a direction perpendicular to the plane, but the c axis can be oriented in an in-plane magnetic field direction by forming a film in a magnetic field or by annealing in a magnetic field. Since the Sin-Fe alloy and the Ho—Co alloy have strong crystal magnetic anisotropy and a large damping constant, magnetization rotation does not easily occurs. Therefore, a ferromagnetic metal layer formed by using these materials has a strong data retention ability.

In a case of $(Fe_xCo_{1-x})N_y$ (1≥x≥0 and y≥0.25) which is a FeCo nitride alloy, a damping constant is increased by nitriding. $Fe_4N$ has α=0.015. Also, in a case of $Fe_{0.7}Co_{0.3}N$, α=0.017 can be obtained.

Damping constants of these are each measured at film thickness of 50 nm or more except for a multilayer film and can be regarded as a value of sufficiently thick bulk substance. When the film thickness is about 10 nm or less, the damping constant tends to rise due to an influence of adjacent layer and a surface thereof. In addition, it is remarkable at 2 nm or less. The damping constant in the present embodiment is defined as a value in a state in which there is no influence of a surface or an interface. A substance having a relatively high damping constant in such a bulk state has a relatively high damping constant even in a case of a thin film, and thus a relatively quick magnetization rotation is achieved. Since a Co/Pt multilayer film has less influence of a surface or an interface, it is defined by a value of damping constant measured in a laminated structure.

An operation of the magnetization rotation of the magnetization rotational element according to the second embodiment is the same as an operation of the magnetization rotation according to the first embodiment. Therefore, also in the magnetization rotation of the magnetization rotational element according to the second embodiment, a direction of the spin injected from the spin-orbit torque wiring into the ferromagnetic metal layer is preferably inclined by 45° or more and 90° or less with respect to the magnetization direction of the ferromagnetic metal layer, and more preferably perpendicular (inclined by 90°) thereto. Also, a film thickness of the ferromagnetic metal layer is preferably 4 nm or less. Further, a lower limit value of the film thickness of the ferromagnetic metal layer is not particularly limited, but is preferably 0.5 nm.

As described above, in the magnetization rotational element according to the second embodiment, the ferromagnetic metal layer contains a predetermined material, and a damping constant of the ferromagnetic metal layer is large. Therefore, in the magnetization rotational element according to the second embodiment, magnetization rotation can be performed quickly.

Third Embodiment

Figure 5:
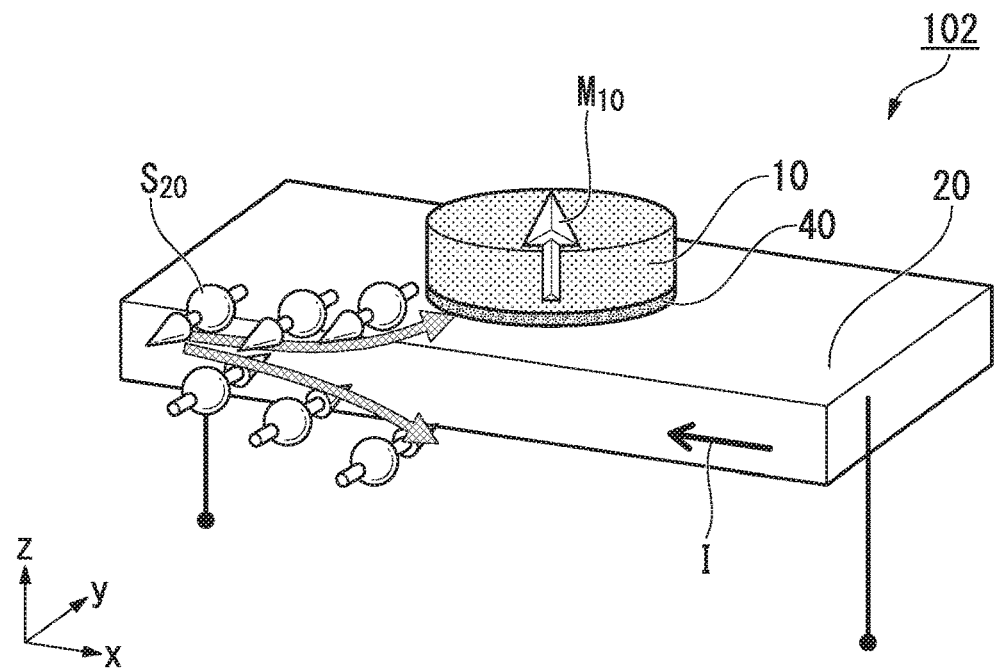
FIG. 5 is a perspective view schematically illustrating a magnetization rotational element according to a third embodiment.

FIG. 5 is a perspective view schematically illustrating a magnetization rotational element according to a third embodiment.

A magnetization rotational element 102 according to the third embodiment includes a ferromagnetic metal layer 10 and a spin-orbit torque wiring 20, and further includes an insertion layer 40 provided there between. Other configurations are the same as those of the magnetization rotational elements according to the first embodiment and the second embodiment, and a direction of spin $S_{20}$ injected from the spin-orbit torque wiring 20 into the ferromagnetic metal layer 10 intersects a direction of magnetization $M_{10}$ of the ferromagnetic metal layer 10.

The insertion layer 40 is made of a heavy metal having a melting point of 2000° C. or higher, or an alloy containing the heavy metal having a melting point of 2000° C. or higher. As such a heavy metal having a melting point of 2000° C. or more, Ta, Ir, Mo, W, and the like can be exemplified. Since these elements cannot easily diffuse even when heat is applied to the magnetization rotational element, characteristics of the magnetization rotational element are not easily deteriorated. Further, when a heavy metal having a melting point of 2000° C. or more comes into contact with the ferromagnetic metal layer 10, a damping constant of the ferromagnetic metal layer 10 increases. Generally, it is said that heavy metals with large contributions of 4d electrons, 5d electrons, or 4f electrons have large spin-orbit interactions. This is because a damping constant is a constant that is influenced by a magnitude of a spin-orbit interaction.

A spin-orbit interaction is an interaction between electron spins and electron orbital angular momentum, and extends to adjacent layers. A damping constant of the ferromagnetic metal layer 10 adjacent to the insertion layer 40 including an alloy containing a rare-earth element also increases.

On the other hand, a film thickness of the insertion layer 40 is preferably equal to or less than twice an atomic radius and less than twice the atomic radius. Here, a layer twice the atomic radius means that it corresponds to a layer of one atomic layer. In other words, it can be said that the film thickness of the insertion layer 40 is equal to or less than a film thickness of one atomic layer, and is preferably less than the film thickness of one atomic layer.

A film thickness less than the film thickness of one atomic layer cannot usually be obtained. The "film thickness of one atomic layer" as used herein means a film thickness formed by film formation conditions necessary for forming a film thickness of one atomic layer, and the "film thickness less than the film thickness of one atomic layer" means a film thickness laminated by film formation conditions less than those conditions described above. It is difficult with current technology to completely arrange atoms in one layer. Therefore, a layer having twice the atomic radius or less can also be said to be a layer having a plurality of gaps in a plan view (when viewed from the z direction) in reality.

The spin $S_{20}$ is injected into the ferromagnetic metal layer 10 from the spin-orbit torque wiring 20 via the insertion layer 40. Therefore, it is preferable that the insertion layer 40 does not disturb a flow of the spin. If the film thickness of the insertion layer 40 is equal to or less than twice the atomic radius as described above, the insertion layer 40 has a plurality of gaps. That is, it is possible to transmit the spin from the spin-orbit torque wiring 20 to the ferromagnetic metal layer 10 via these gaps.

An operation of the magnetization rotation of the magnetization rotational element 102 according to the third embodiment is similar to the operation of the magnetization rotation according to the first embodiment. Therefore, also in the magnetization rotation of the magnetization rotational element 102 according to the third embodiment, a direction of the spin injected from the spin-orbit torque wiring 20 into the ferromagnetic metal layer 10 is preferably inclined by 45° or more and 90° or less with respect to the direction of the magnetization of the ferromagnetic metal layer 10, and more preferably perpendicular (inclined by 90°) thereto. Also, a film thickness of the ferromagnetic metal layer 10 is preferably 4 nm or less. Further, a lower limit value of the film thickness of the ferromagnetic metal layer 10 is not particularly limited, but is preferably 0.5 nm.

As described above, in the magnetization rotational element 102 according to the third embodiment, a damping constant of the ferromagnetic metal layer 10 increases due to an influence of the insertion layer 40 adjacent to the ferromagnetic metal layer 10. Therefore, in the magnetization rotational element 102 according to the third embodiment, magnetization rotation can be performed quickly.

Fourth Embodiment

Figure 6:
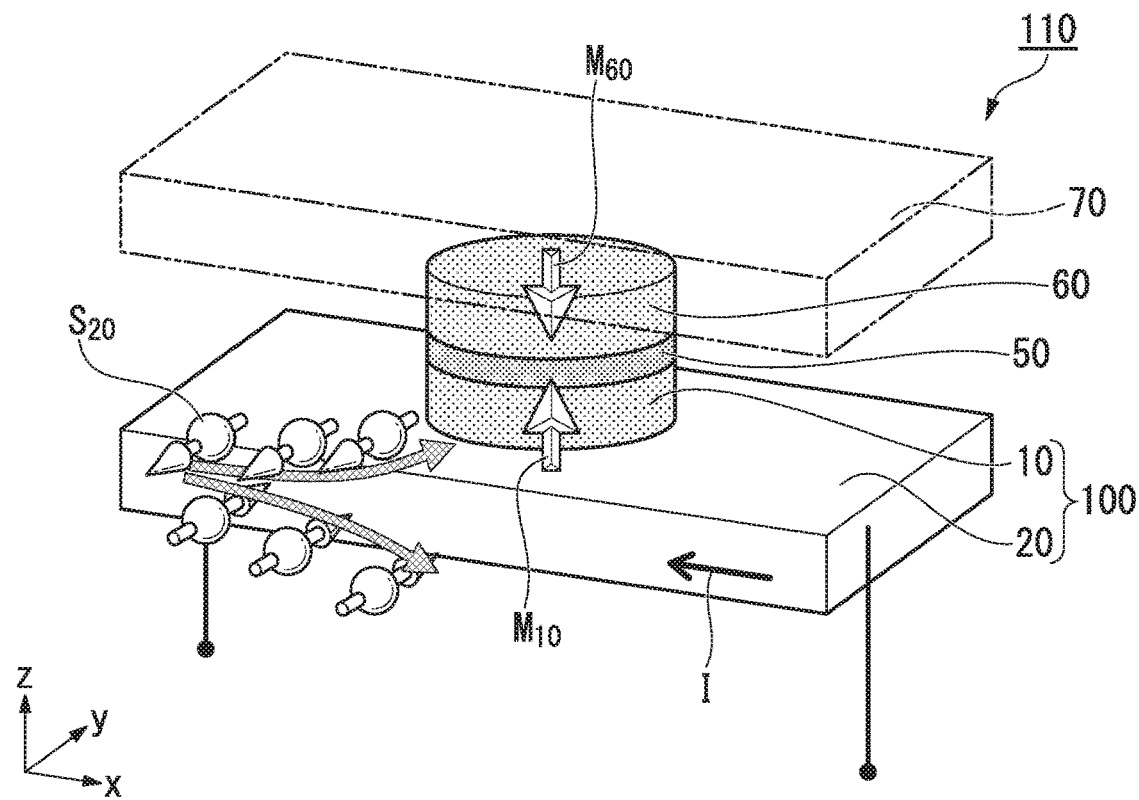
FIG. 6 is a perspective view schematically illustrating a magnetoresistance effect element according to a fourth embodiment.

FIG. 6 is a perspective view schematically illustrating a magnetoresistance effect element according to a fourth embodiment. A magnetoresistance effect element 110 illustrated in FIG. 6 includes the magnetization rotational element 100 according to the first embodiment, a nonmagnetic layer 50, a second ferromagnetic metal layer 60, and a wiring layer 70.

The magnetization rotational element 100 includes a ferromagnetic metal layer 10 and a spin-orbit torque wiring 20. The nonmagnetic layer 50 and the second ferromagnetic metal layer 60 are laminated in this order on a surface of the ferromagnetic metal layer 10 on a side opposite to the spin-orbit torque wiring 20. Although an example of using the magnetization rotational element 100 according to the first embodiment is exemplified as a representative magnetization rotational element, the magnetization rotational element according to the second embodiment or the third embodiment may also be applied.

The second ferromagnetic metal layer 60 is a fixed layer in which magnetic anisotropy is relatively stronger than that of the ferromagnetic metal layer 10 and a magnetization direction is fixed in one direction.

For a material of the second ferromagnetic metal layer 60, a known material can be used. For example, a metal selected from the group consisting of Cr, Mn, Co, Fe, and Ni, and an alloy containing one or more of these metals and exhibiting ferromagnetism can be used. It is also possible to use an alloy containing these metals and at least one of elements B, C, and N. Specifically, Co—Fe or Co—Fe—B can be exemplified.

In order to obtain a higher output, it is preferable to use a Heusler alloy such as $Co_2FeSi$. The Heusler alloy contains an intermetallic compound having a chemical composition of $X_2YZ$, in which X indicates a transition metal element of Co, Fe, Ni, or Cu group, or a noble metal element in the periodic table, Y indicates a transition metal of Mn, V, Cr, or Ti group, and can also be elemental species of X, and Z indicates a typical element from Group III to Group V. For example, $Co_2FeSi$, $Co_2MnSi$, $Co_2Mn_{1-a}Fe_aAl_bSi_{1-b}$, or the like can be exemplified.

Also, in order to further increase a coercivity of the second ferromagnetic metal layer 60, an antiferromagnetic material such as IrMn, PtMn, or the like may also be brought into contact with a surface of the second ferromagnetic metal layer 60 on a side opposite to the nonmagnetic layer 50. Further, in order to prevent a leakage magnetic field of the second ferromagnetic metal layer 60 from affecting the ferromagnetic metal layer 10, a synthetic ferromagnetic coupling structure may also be employed.

For the nonmagnetic layer 50, a known material can be used.

For example, when the nonmagnetic layer 50 is formed of an insulator (in a case of a tunnel barrier layer), $Al_2O_3$, $SiO_2$, Mg, $MgAl_2O_4O$, or the like can be used as the material. In addition to these materials, a material in which a part of Al, Si, and Mg is substituted with Zn, Be, or the like can also be used. Of these, since MgO and $MgAl_2O_4$ are materials that can realize coherent tunneling, spin can be efficiently injected.

Further, when the nonmagnetic layer 50 is formed of a metal, Cu, Au, Ag, or the like can be used as the material.

The wiring layer 70 is not particularly limited as long as it has conductivity. For example, copper, aluminum, or the like can be used.

The magnetoresistance effect element 110 according to the fourth embodiment can read a magnetization state of the ferromagnetic metal layer 10 by measuring a resistance value between the spin-orbit torque wiring 20 and the wiring layer 70. The resistance value decreases when a direction of magnetization $M_{10}$ of the ferromagnetic metal layer 10 is parallel to magnetization $M_{60}$ of the second ferromagnetic metal layer 60, and increases when the direction of the magnetization $M_{10}$ of the ferromagnetic metal layer 10 is antiparallel to the magnetization $M_{60}$ of the second ferromagnetic metal layer 60.

As described above, according to the magnetoresistance effect element 110 of the fourth embodiment, it is possible to appropriately read information of the magnetization rotational element 100 that can quickly perform magnetization rotation.

Further, the magnetoresistance effect element 110 can be used for a memory device or the like. A memory device including the magnetoresistance effect element 110 and a control element such as a transistor connected to the spin-orbit torque wiring 20 can be exemplified. A current flowing through the spin-orbit torque wiring 20 can be controlled by the control element, and an amount of spin injected into the ferromagnetic metal layer 10 is controlled so that a direction of the magnetization $M_{10}$ can be controlled.

(Method of Manufacturing Element)

The magnetization rotational element and the magnetoresistance effect element described above can be manufactured by a known film formation means such as sputtering and a processing technology such as photolithography. A metal and the like constituting each layer are laminated in order on a substrate serving as a support and then processed into a predetermined shape.

As film formation methods, a vapor deposition method, a laser ablation method, a molecular beam epitaxy (MBE) method, and the like can be exemplified in addition to the sputtering method. In the photolithography method, a photoresist film is formed at a portion desired to be left, and unnecessary portions are removed by a process such as ion milling or reactive ion etching (RIE).

For example, in a case of manufacturing a tunnel magnetoresistance (TMR) element as a magnetoresistance effect element, for example, a tunnel barrier layer is formed first by sputtering a metal thin film of about 0.4 to 2.0 nm on the ferromagnetic metal layer, performing plasma oxidation or natural oxidation by introducing oxygen, and performing subsequent heat treatment.

The present invention is not necessarily limited to the configuration and manufacturing method of the magnetization rotational element and the magnetoresistance effect element according to the above embodiments, and various modifications can be made without departing from the gist of the present invention. Further, in the first, second and fourth embodiments, the ferromagnetic metal layer is joined to the spin-orbit torque wiring, and in the third embodiment, the ferromagnetic metal layer is joined to the spin-orbit torque wiring with the insertion layer interposed therebetween, but the present invention is not limited thereto. Other layers may be interposed between the ferromagnetic metal layer and the spin-orbit torque wiring as long as spin of the spin-orbit torque wiring can be injected into the ferromagnetic metal layer. As a layer that can be interposed between the ferromagnetic metal layer and the spin-orbit torque wiring, a layer formed of Ta, Ir, Mo, W, La, or Lu having a thickness of about 0.5 to 2 nm can be exemplified.

EXAMPLE

Example 1

In Example 1, behavior of magnetization rotation of the ferromagnetic metal layer was confirmed by simulation. The simulation was performed using a conventional magnetic field simulation package software "FUJITSUMAN Manufacturing Industry Solution EXAMAG LLG SIMULATOR V2" which is widely used to confirm behavior of magnetization rotation of a spin transfer torque. It is known that a corresponding relationship between results of the software and actual measured values can be obtained.

Figure 7:
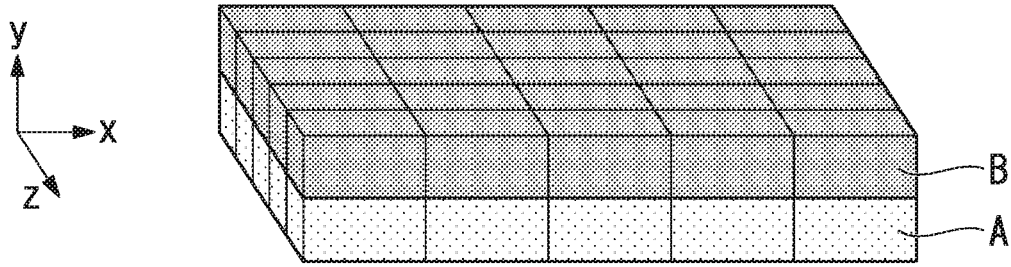
FIG. 7 is a schematic view of a calculation model used for a simulation.

FIG. 7 is a schematic view of a calculation model used for the simulation. As illustrated in FIG. 7, 25 meshes with a side of 2 nm and a height of 1 nm were used as a first layer A, and the same mesh was laminated to be disposed on the first layer A to form a second layer B. xyz directions illustrated in FIG. 7 are a setting for simulation and do not necessarily coincide with the xyz directions according to the embodiments.

The first layer A was set as a free layer in which magnetization was rotatable, and the second layer B was set as a fixed layer in which magnetization was fixed. That is, the first layer A corresponds to the ferromagnetic metal layer 10 in which magnetization is rotated in FIG. 1, and the second layer B corresponds to the spin-orbit torque wiring 20 for injecting spin in FIG. 1.

In the simulation, it was assumed that there was no magnetic coupling between layers of the first layer A and the second layer B, and magnetization of the second layer B was fixed in the z direction illustrated in FIG. 7. At this time, saturation magnetization $M_s$ of the second layer B was $1.0 \times 10^{-5}$ T.

Regarding magnetization of the first layer A, the first layer A was set in a vertical magnetization film having an axis of easy magnetization in the y direction. The saturation magnetization $M_s$ of the second layer B was 1.0 T, and exchange stiffness A was $1.49 \times 10^{-11}$ J/m. An anisotropic magnetic field Hk was 1.2 T and a damping constant (Gilbert relaxation coefficient) a was 0.01. Thus, a model in which spin of the second layer B oriented in the z direction was injected into the first layer A was reproduced.

That is, conditions of magnetization at the time of magnetization rotation were as follows. Initial conditions were $m_x=0$, $m_y=1.0$, $m_z=0$. This indicates that spin of the first layer A is oriented in the +y direction. Further, $m_x$, $m_y$, and $m_z$ are magnetization of the ferromagnetic metal layer respectively in the x direction, the y direction, and the z direction in an initial state, and are initial values of Mx, My, and Mz to be described below. Spin injection from the second layer B to the first layer A was assumed on the basis of a current flowing in the x direction. A current density was $1.5 \times 10^{11}$ A/m$^2$, and an external magnetic field was $H_x=-1300$ Oe.

Figure 8:
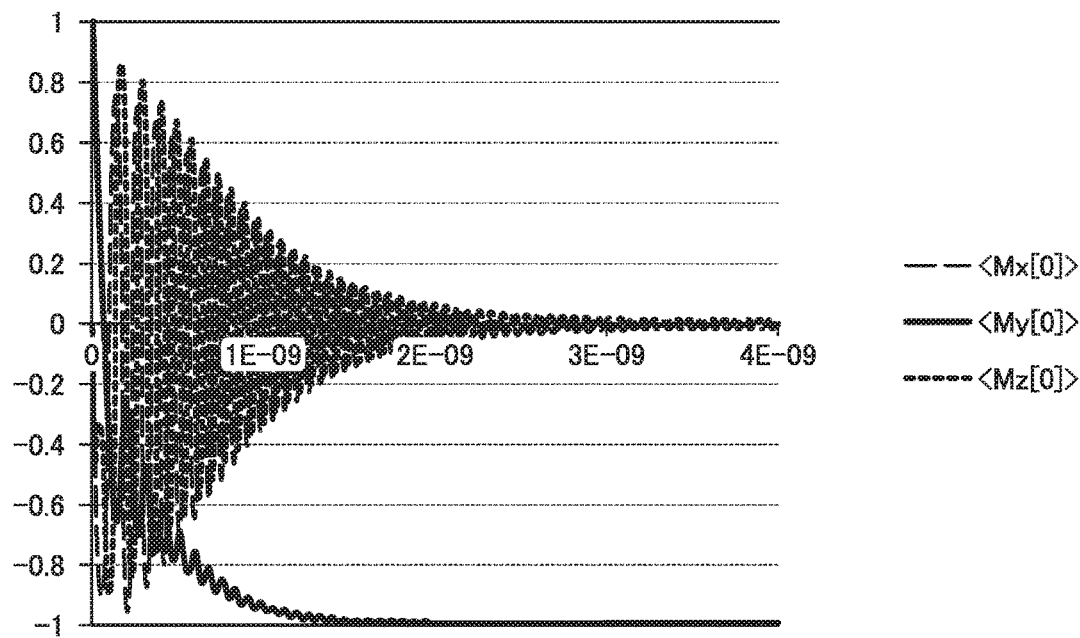
FIG. 8 is a view showing a magnetization intensity of a ferromagnetic metal layer of Example 1.
Figure 8:
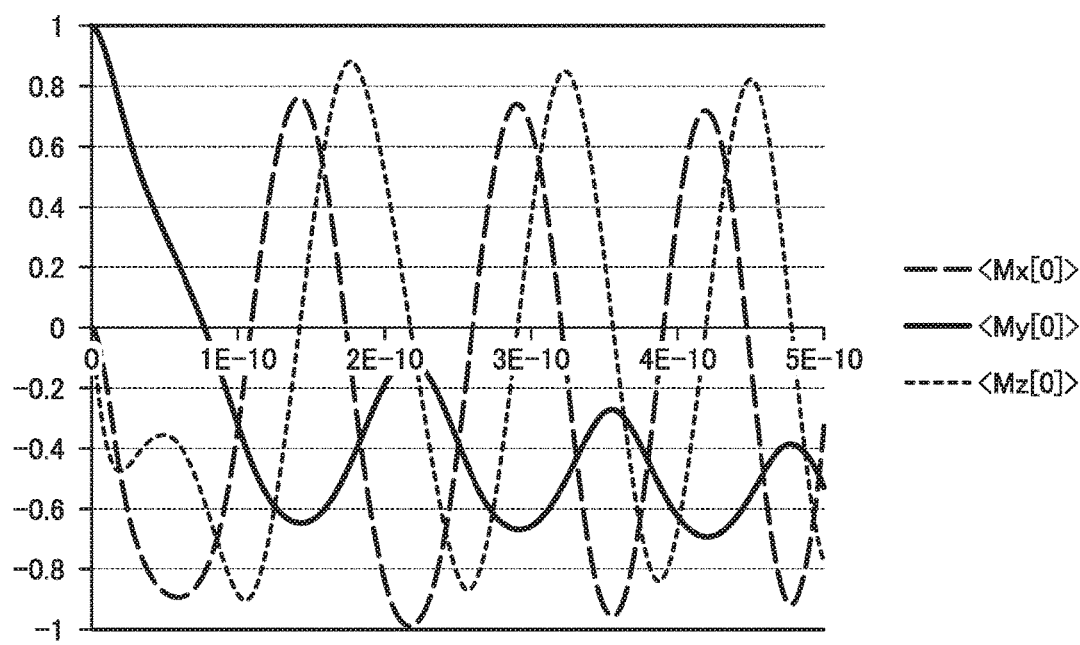

FIG. 8 is a view showing a magnetization intensity of the ferromagnetic metal layer of Example 1. A horizontal axis is seconds and a vertical axis indicates magnitudes of each of Mx, My and Mz. Further, Mx, My, and Mz are respective magnetization of the ferromagnetic metal layer in the x direction, the y direction, and the z direction. FIG. 8 (a) is a view showing an entire process in which magnetization of the ferromagnetic metal layer is rotated, and FIG. 8 (b) is a view in which initial behavior thereof is extracted.

As illustrated in FIG. 8 (a), time required for entire magnetization rotation from My=1.0 (+y direction) until reaching My=−1.0 (−y direction) was $1 \times 10^{-9}$ seconds. As illustrated in FIG. 8 (b), time required for initial behavior from My=1.0 until reaching My=0 was $1 \times 10^{-10}$ seconds or less. In this way, it can be said that the time required for the initial behavior in the total time required for magnetization rotation was equal to or less than $\frac{1}{10}$ of the total.

Examples 2 and 3

In Examples 2 and 3, simulations were performed under the same conditions as those in Example 1 except that a damping constant α was changed. The damping constant α was set to 0.02 in the second embodiment, and the damping constant α was set to 0.1 in the third embodiment.

Figure 9:
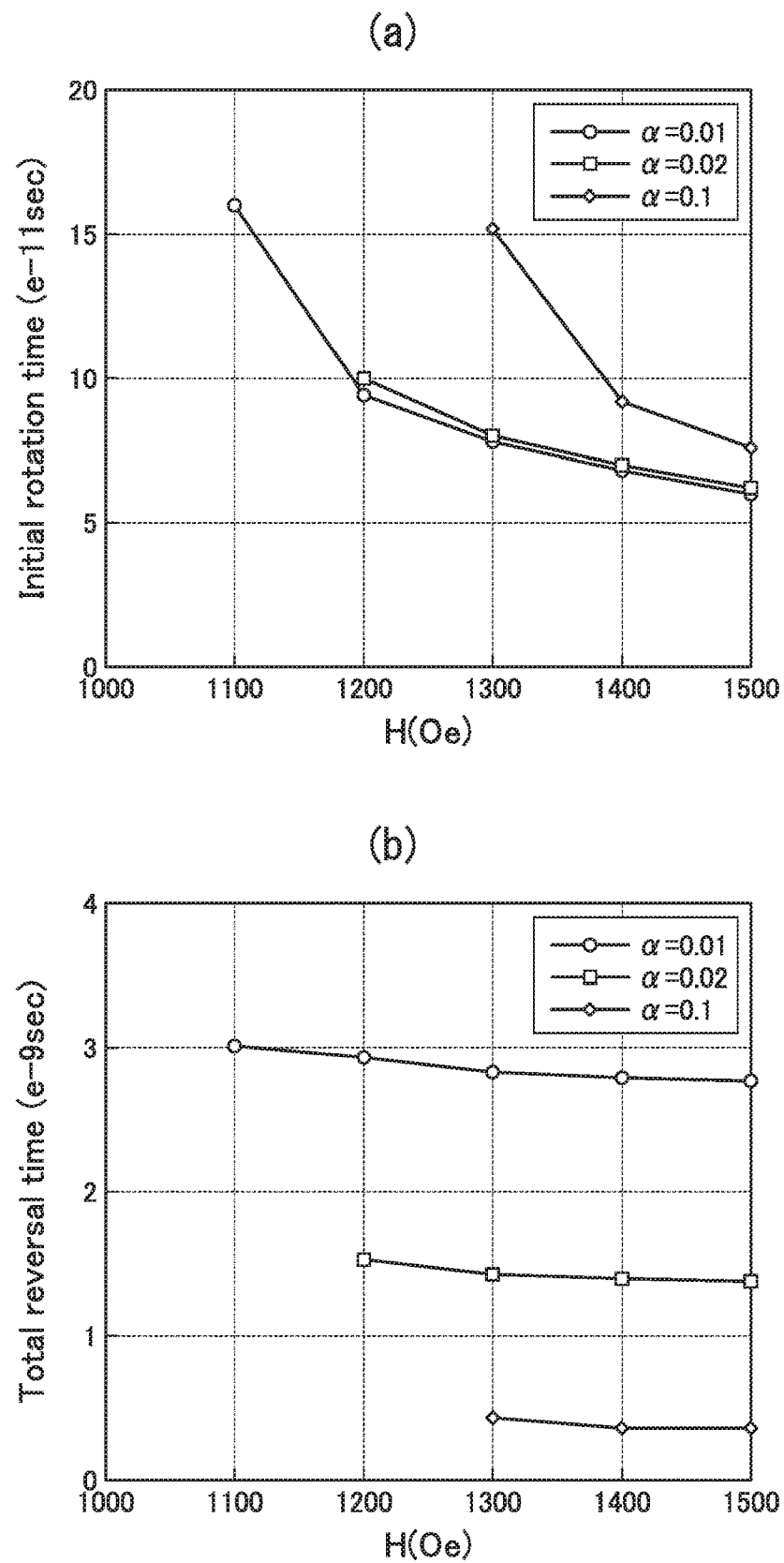
FIG. 9 is a view showing a relationship between applied magnetization and time required for magnetization rotation when magnetization of the ferromagnetic metal layer of Examples 1 to 3 is rotated.

FIG. 9 is a view showing a relationship between applied magnetization and time required for magnetization rotation when magnetization of the ferromagnetic metal layer of Examples 1 to 3 is rotated. A vertical axis in FIG. 9 (a) is time required for initial behavior, and a vertical axis in (b) is time required until reaching the magnetization rotation. Both the horizontal axes are a magnitude H (Oe) of an applied external magnetic field.

As shown in FIG. 9 (a), time required for the initial behavior tended to be longer as a damping constant becomes larger. However, as the damping constant increases, the time required for the initial behavior becomes shorter with respect to the time required for the magnetization rotation to be completed. Therefore, as shown in FIG. 9 (b), as the damping constant increased under conditions of the same applied magnetization, the time required for magnetization rotation became shorter.

Examples 4 to 6

In Examples 4 and 6, simulations were performed under the same conditions as those in Examples 1 to 3 except that an applied current density was $3.5 \times 10^{11}$ A/m$^2$. The damping constant α was set to 0.01 in Example 4, the damping constant α was set to 0.02 in Example 5, and the damping constant α was set to 0.1 in Example 6.

Figure 10:
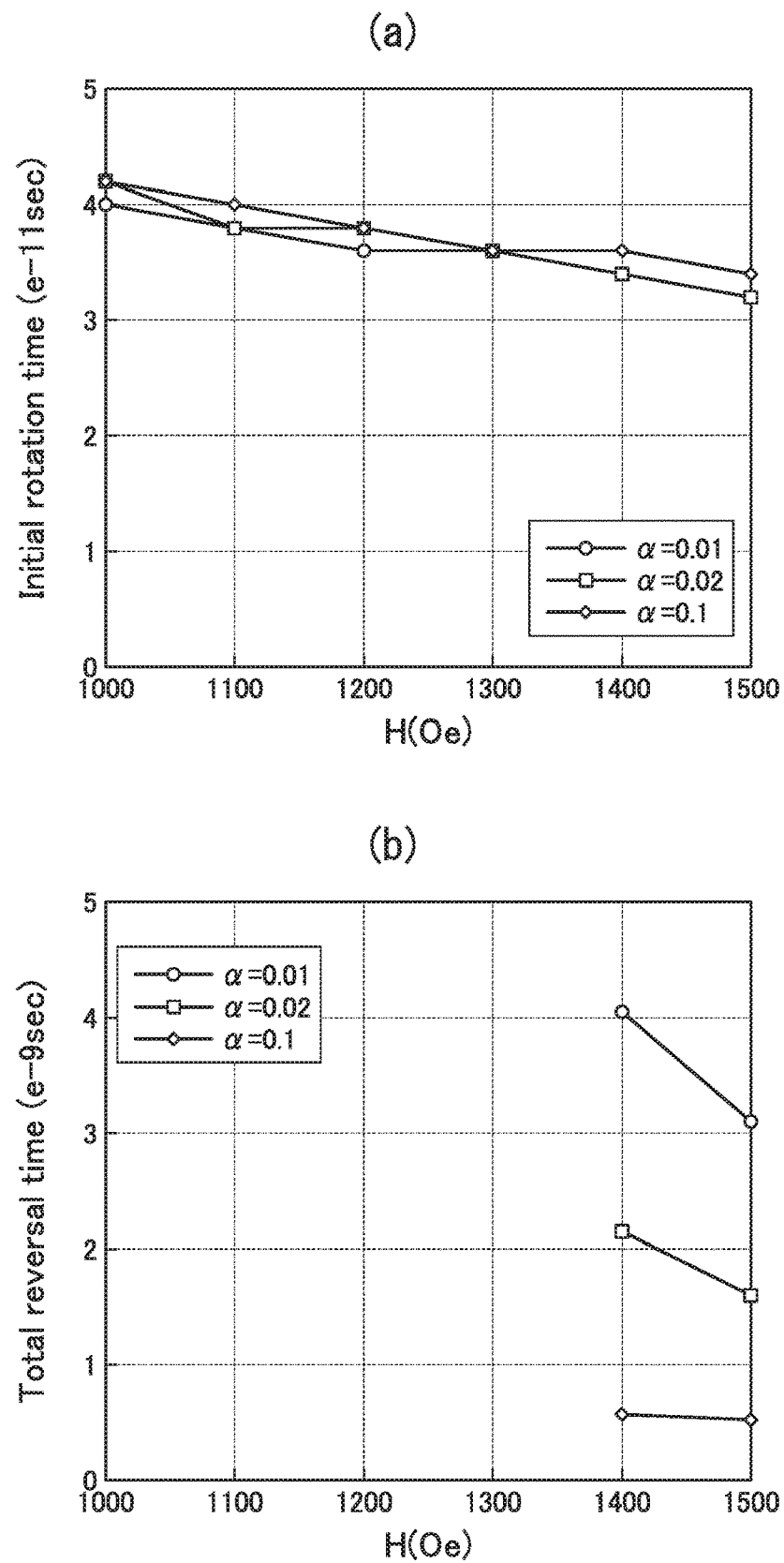
FIG. 10 is a view showing a relationship between applied magnetization and time required for magnetization rotation when magnetization of the ferromagnetic metal layer of Examples 4 to 6 is rotated.
Figure 11:
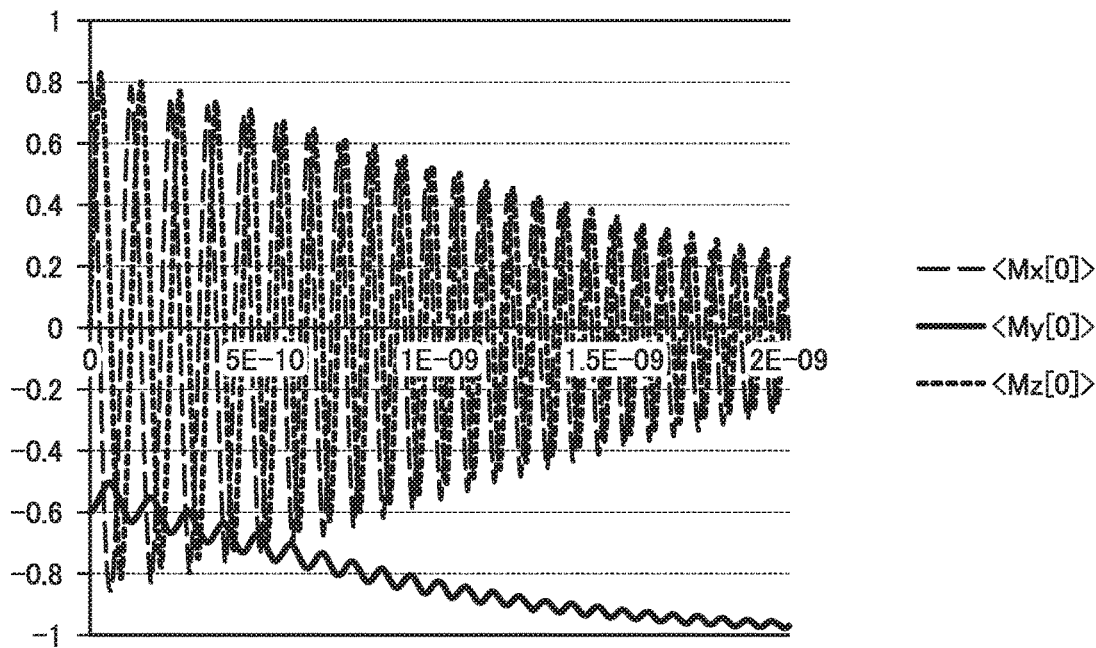
FIG. 11 is a view showing behavior of magnetization of Example 7.
Figure 12:
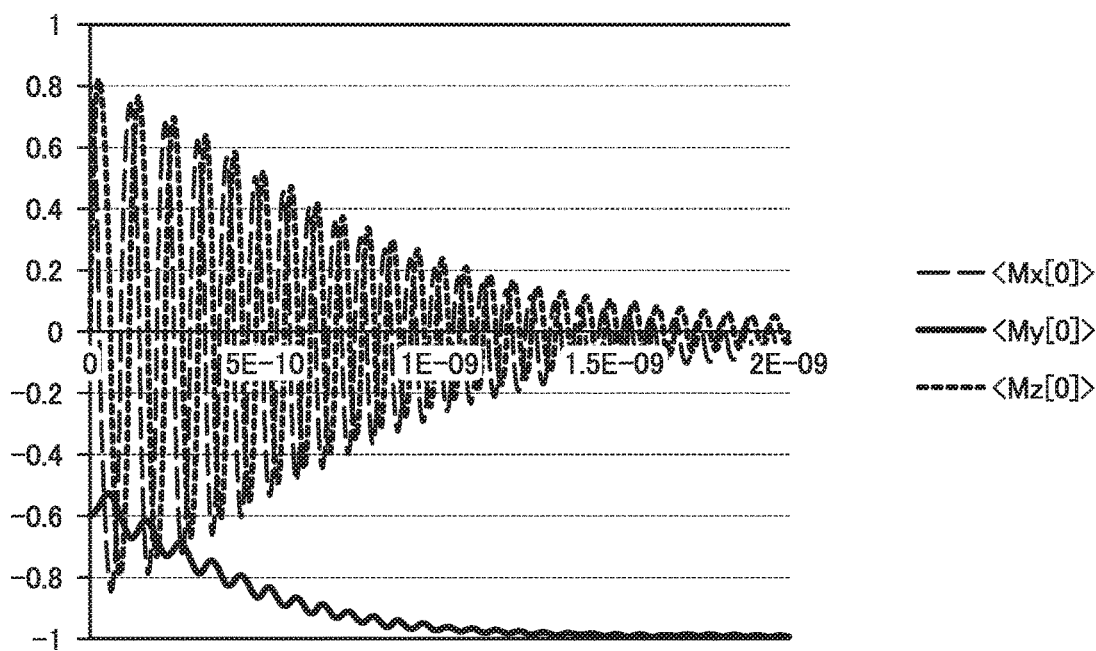
FIG. 12 is a view showing behavior of magnetization of Example 8.
Figure 13:
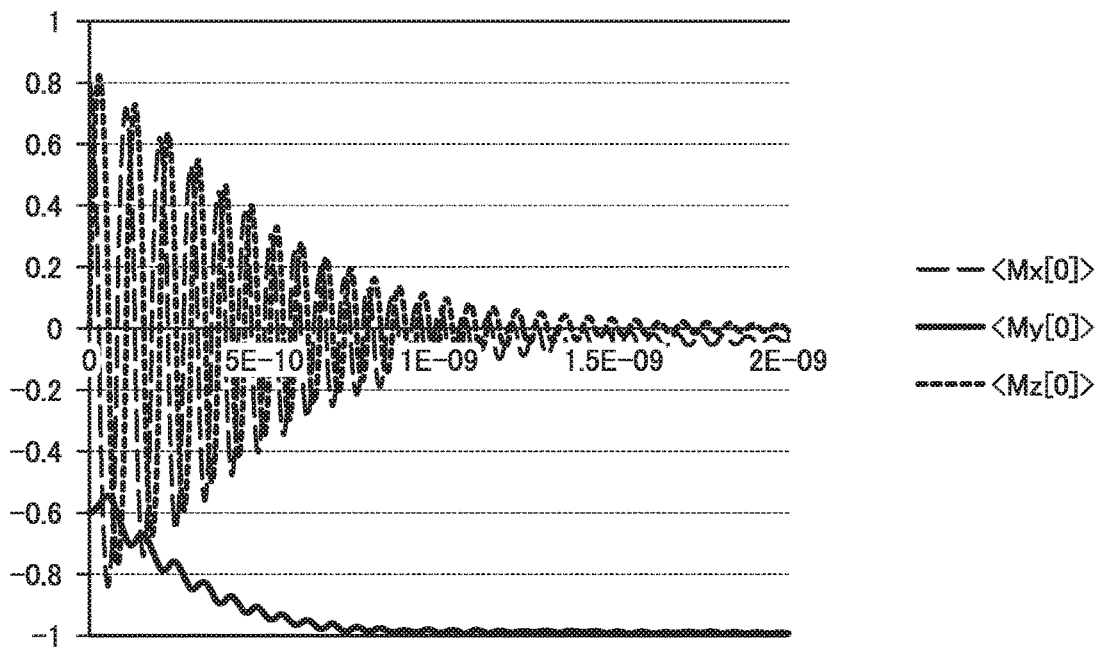
FIG. 13 is a view showing behavior of magnetization of Example 9.
Figure 14:
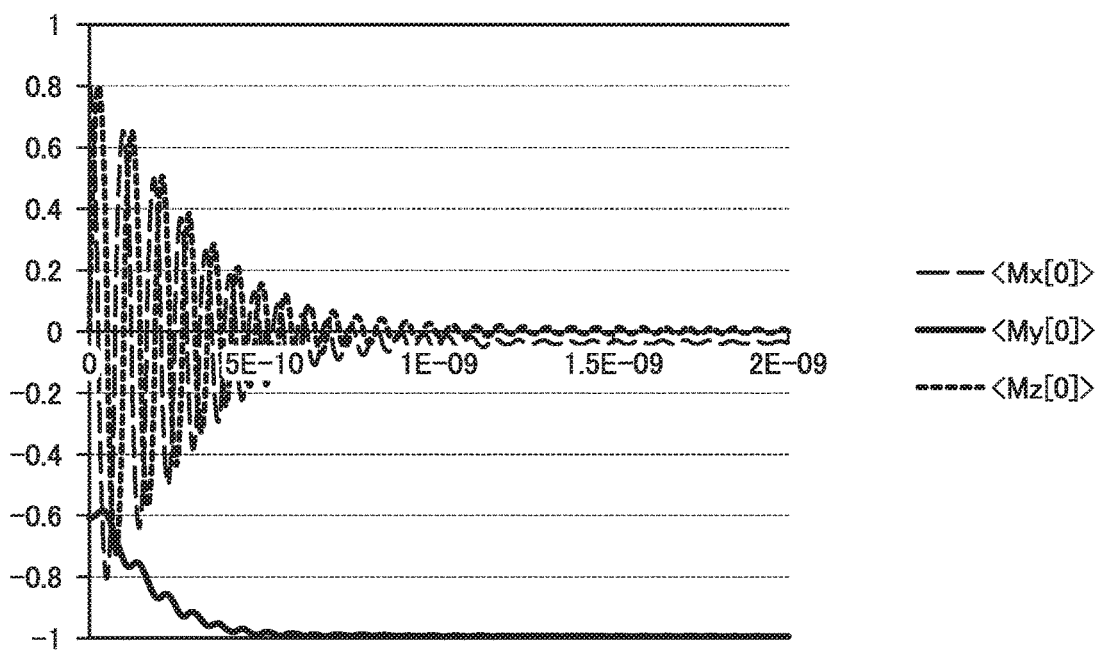
FIG. 14 is a view showing behavior of magnetization of Example 10.
Figure 15:
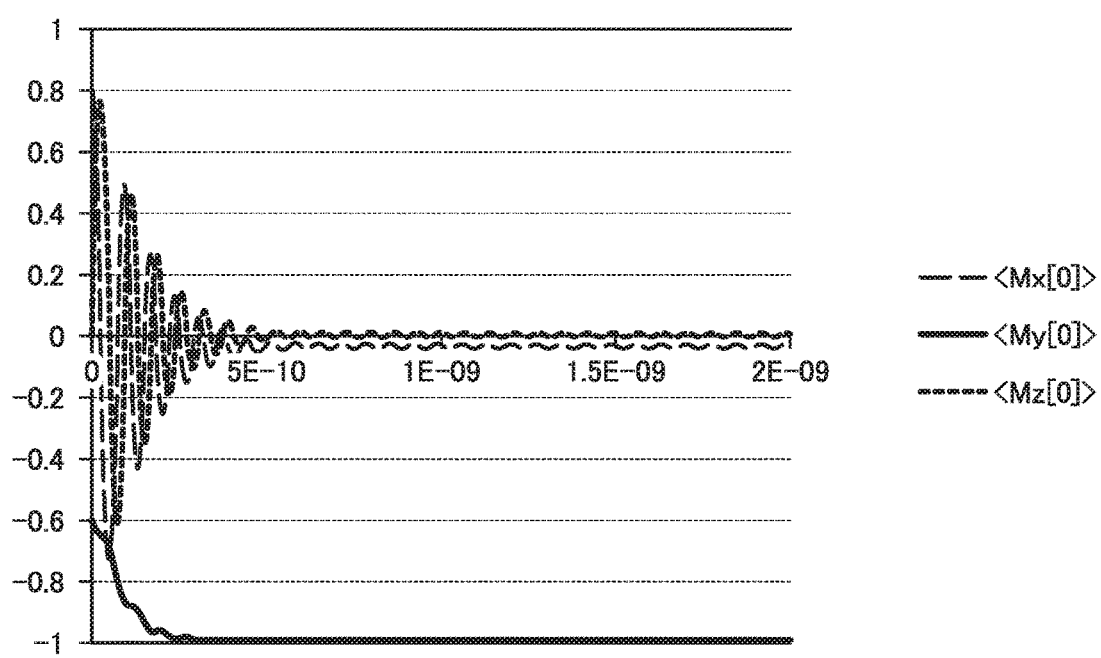
FIG. 15 is a view showing behavior of magnetization of Example 11.

FIG. 10 is a view showing a relationship between applied magnetization and time required for magnetization rotation when magnetization of the ferromagnetic metal layer of Examples 4 to 6 is rotated. A vertical axis in FIG. 10 (a) is time required for initial behavior, and a vertical axis in (b) is time required until completing the magnetization rotation. Both the horizontal axes are a magnitude H (Oe) of an applied external magnetic field.

As shown in FIG. 10 (a), as an applied current density increased, an influence of a damping constant on the time required for the initial behavior decreased. When the applied current density was increased, an amount of spin injected into the first layer A increased and a force applied to magnetization increased. Therefore, it is considered that the influence of the damping constant decreased. On the other hand, even when the applied current density was increased as illustrated in FIG. 10 (b), the time required for magnetization rotation was shortened as the damping constant increased.

Examples 7 to 11

In Examples 7 to 11, after magnetization was rotated by 90° due to initial behavior, a state in which the magnetization received a force to be oriented in an easy magnetization direction and performed precessional motion was schematically simulated.

In Examples 7 to 11, initial conditions were set to $m_x=0.8$, $m_y=-0.6$, $m_z=0$. That is, behavior of the spin of the first layer A after being inclined almost in the −y direction was confirmed. A current density was set to $1.0 \times 10^8$ A/m$^2$, and an external magnetic field was set to $H_x=-200$ Oe. The damping constant α was 0.01 in Example 7, the damping constant α was 0.02 in Example 8, the damping constant α was 0.03 in Example 9, the damping constant α was 0.05 in Example 10, and the damping constant α was 0.1 in Example 9.

FIGS. 11 to 15 are views showing behavior of magnetization in each of Examples 7 to 11. A horizontal axis is seconds and a vertical axis indicates magnitudes of each of Mx, My and Mz. As illustrated in FIGS. 11 to 15, the larger the damping constant, the faster the convergence process of the precessional motion from My=−0.6 to My=−1.0. That is, it was understood that, by increasing the damping constant, a second half process of magnetization rotation could be accelerated and time required for the entire magnetization rotation could be shortened.

INDUSTRIAL APPLICABILITY

According to the magnetization rotational element of the present invention, since the magnetization rotation can be performed quickly, the magnetization rotational element of the present invention is suitable for a memory device.

REFERENCE SIGNS LIST 10, 11 Ferromagnetic metal layer
20 Spin-orbit torque wiring
$M_{10}$, $M_{11}$, $M_{31}$, $M_{33}$, $M_{60}$ Magnetization
$S_{20}$ Spin
30 Magnetoresistance effect element
31 Free layer
32 Nonmagnetic layer
33 Fixed layer
34 Wiring
40 Insertion layer
50 Nonmagnetic layer
60 Second ferromagnetic metal layer
70 Wiring layer
100, 101, 102 Magnetization rotational element
A First layer
B Second layer

The invention claimed is:

1. A magnetization rotational element comprising:
a ferromagnetic metal layer;
a spin-orbit torque wiring extending in a first direction intersecting a lamination direction of the ferromagnetic metal layer, the ferromagnetic metal layer being positioned on one surface of the spin-orbit torque wiring; and
an insertion layer provided between the ferromagnetic metal layer and the spin-orbit torque wiring, wherein:
the insertion layer includes a heavy metal having a melting point of 2000° C. or higher or an alloy containing the heavy metal,
a film thickness of the insertion layer is less than a film thickness of one atomic layer thereof, and
the insertion layer includes a plurality of gaps.

2. The magnetization rotational element according to claim 1, wherein a film thickness of the ferromagnetic metal layer is 4 nm or less.

3. A magnetoresistance effect element comprising:
the magnetization rotational element according to claim 1; and
a nonmagnetic layer and a second ferromagnetic metal layer laminated in this order on a surface of the ferromagnetic metal layer on a side opposite to the spin-orbit torque wiring.

4. A memory device comprising the magnetoresistance effect element according to claim 3.

5. The magnetization rotational element according to claim 1, wherein the heavy metal is selected from the group consisting of Ta, Ir, and W.

6. The magnetization rotational element according to claim 1, wherein a direction of spin injected from the spin-orbit torque wiring into the ferromagnetic metal layer intersects a magnetization direction of the ferromagnetic metal layer.

7. The magnetization rotational element according to claim 6, wherein the direction of the spin injected from the spin-orbit torque wiring into the ferromagnetic metal layer is inclined by 45° or more and 90° or less with respect to the magnetization direction of the ferromagnetic metal layer.

8. The magnetization rotational element according to claim 7, wherein a film thickness of the ferromagnetic metal layer is 4 nm or less.

9. The magnetization rotational element according to claim 1, wherein the film thickness of the insertion layer is an average film thickness.

10. The magnetization rotational element according to claim 1, wherein the insertion layer is configured to transmit the spin from the spin-orbit torque wiring to the ferromagnetic metal layer via the plurality of gaps.

* * * * *